United States Patent [19]
Delamotte et al.

[11] Patent Number: 5,689,451
[45] Date of Patent: Nov. 18, 1997

[54] DEVICE FOR CALCULATING PARITY BITS ASSOCIATED WITH A SUM OF TWO NUMBERS

[75] Inventors: Pascal Delamotte, Rueil Malmaison; Michel Thill, Les Clayes sous Bois, both of France

[73] Assignee: Bull S.A., Puteaux, France

[21] Appl. No.: 714,486

[22] Filed: Sep. 16, 1996

Related U.S. Application Data

[63] Continuation of Ser. No. 350,189, Nov. 30, 1994, abandoned.

[30] Foreign Application Priority Data

Nov. 30, 1993 [FR] France ................... 93 14287

[51] Int. Cl.[6] ......................................... G06F 11/00
[52] U.S. Cl. ........................................... 364/738
[58] Field of Search ............................... 364/737, 738; 371/49.1, 49.2, 49.4

[56] References Cited

U.S. PATENT DOCUMENTS

| | | | |
|---|---|---|---|
| 3,925,647 | 12/1975 | Louie | 364/738 |
| 4,879,675 | 11/1989 | Brodnax | 364/738 |
| 4,924,423 | 5/1990 | Vassiliadis et al. | 364/738 |
| 4,958,353 | 9/1990 | Greiner et al. | 364/738 X |

FOREIGN PATENT DOCUMENTS

| | | |
|---|---|---|
| 0329545 | 2/1989 | European Pat. Off. . |
| 0339296 | 4/1989 | European Pat. Off. . |

*Primary Examiner*—Chuong D. Ngo
*Attorney, Agent, or Firm*—Kerkam, Stowell, Kondracki & Clarke, P.C.; Edward J. Kondracki

[57] ABSTRACT

In an adder that finds the sum of two binary numbers A and B, it is now conventional to associate one or more parity bits (PA, PB, PS) with each of the two numbers A and B and the result S. Each number A and B and the result S is divided into K groups each of m bits, and one parity bit is associated with each group. In accordance with the invention, the parity PS associated with the result S is obtained at the same time as the result. The input carry bit $c_i n$ intervening in the addition is available before the beginning of operations. Consequently, it is used in a first stage 10' upstream of the device, which calculates intermediate variables $p_{i,j}$ and $g_{i,j}$. The other input carry bits $c_{i,1}$ corresponding to the other groups are determined only later by a carry look ahead circuit, and consequently they are used only in a second stage 50' downstream of the device. The use of $c_i n$ in the first stage 10' makes it possible to perform the calculation of the parity bits and look ahead for the carry bits with a single circuit present in a third stage 60, which is intermediate between the first stage 10' and the second stage 50'.

10 Claims, 7 Drawing Sheets

DEVICE FOR CALCULATING PARITY BITS ASSOCIATED WITH A SUM OF TWO NUMBERS

This is a Continuation of application Ser. No. 08/350,189, filed Nov. 30, 1994 now abandoned.

FIELD OF THE INVENTION

The invention relates to the calculation of the parity bits associated with the result of addition performed by an adder, particularly in computer processors.

In general, parity bits associated with binary words or numbers are used so as to be able to detect whether these words or numbers have become burdened with errors in the course of being manipulated in the processing circuits.

The parity bit associated with a word is conventionally defined as the result of the combination, by operations of the "EXCLUSIVE-OR" type, of all the bits making up the word. The parity bit then assumes the value "1" if the number of "1"s contained in the word is odd. Thus when only a single bit or an odd number of bits of the group are erroneous, the parity bit assumes the complimentary value of the value that it should have. The errors can then be detected by simple comparison between the actual parity bit calculated from the bits making up the word and the value of the parity bit. To increase the error detection rate, it is typical to divide the words into K groups of m bits, each group being associated with one parity bit. A word can then be associated with more than one parity bit. For example, a 32-bit word can be divided into four groups of eight bits each, and each group is associated with one parity bit. This method enables the detection of multiple errors affecting different groups.

When operations affecting one or more words are performed, it is appropriate for the result of this operation also to be associated with one or more parity bits. This is especially true for addition operations.

The parity bit or bits associated with the result of an addition can be calculated directly from the result. In that case, however, the parity bits of the result cannot be obtained until after the result itself has been obtained, which delays the time when the result and its associated parity bits can be used in the ensuing processing.

In a modern arithmetic and logic unit including a 32-bit or even 64-bit adder, the problem of error detection becomes even more crucial. An effective error detection method consists of predicting the parity bits of the sum regardless of the calculation of the sum, then calculating the parity bits directly from the result obtained. Comparing these bits makes it possible to generate an error signal, if appropriate, indicating improper function of the adder. In this case as well, it is desirable for parity bits, obtained from the operands, to be available no later than the moment when the result of the addition is available.

The problem of predicting the parity bits of a sum has been addressed in numerous articles that provide solutions in particular cases. This prior art is illustrated for example by IBM Technical Disclosure Bulletin, Vol. 23, No. 12, May 1981, pp. 5498–5502.

U.S. Pat. No. 4,224,680, entitled "Parity Prediction Circuit for Adder/Counter", also proposes an embodiment adapted to carry propagation adders (known as "carry ripple adders" in English) and counters. The circuit proposed uses a plurality of cascade-mounted stages PP0-PPn. Each stage furnishes the transmission bits $x_i$ and $y_i$ such that:

$$x_i = (p_i x_{i-1})^*,$$

$$y_i = y_{i-1} \overline{\oplus} (g_i x_{i-1})^*$$

where $$p_i = a_i \oplus b_i,$$

$$g_i = a_i b_i$$

$a_i$ and $b_i$ being the operand bits, $\oplus$ being the "EXCLUSIVE-OR" operation, $\overline{\oplus}$ being the operation complementary to "EXCLUSIVE-OR", and the symbol * indicating the complementation operation.

The parity bit of the sum is then obtained by an output stage PPout performing a logical operation on $x_n$, $y_n$, $C_{in}$, Pa, Pb, where $C_{in}$ is the input carry and Pa and Pb are the parities of the operands.

However, this solution is unsatisfactory in conjunction with high-speed adders, such as carry anticipation adders ("carry look ahead" in English), because in that case the parity bit will be obtained even after the result of the addition, which slows down the ensuing processing.

European Patent EP 329 545 of the present Applicant, entitled "Dispositif pour le calcul des bits de parité d'une somme de deux nombres" corresponding to U.S. Pat. No. 4,958,353 [Device for Calculating the Parity Bits of a Sum of Two Numbers], proposes an embodiment that is also suitable for high-speed adders, such as carry look ahead adders. In this embodiment, the parity bits of the sum are obtained by calculating the parity for the carry word, rather than the sum word.

Carry look ahead adders make it possible to obtain all the carry bits before the sum bits, and hence this patent proposes a solution that, once the carry bit calculation has been done, makes a maximal reduction in the further time required to deduce the associated parity bits. The device performs calculation in two steps:

a first step, which as its input variables uses the variables that depend solely on the operands;

a second, high-speed step causing the carry bits to intervene.

The first step takes place during the calculation of the carry bits by the look ahead circuit of the adder, and given the relative slowness of this calculation, this first step is designed to perform a maximum number of preparatory calculations, thus making it possible to simplify the second step, thus making it faster.

Under certain conditions, with this embodiment, the parity bit or bits associated with the sum may be obtained before the sum itself. Nevertheless, this device has the disadvantage of being quite complex and of requiring a large number of logic circuits for its implementation. Moreover, because of its structure, it is poorly suited to physical implementation in a regular "data path" type of structure, which is frequently used in CMOS technology, for instance.

SUMMARY OF THE INVENTION

The object of this invention is accordingly to optimize the performance, in terms of speed and implantation surface area, of the device described in the above patent, while preserving the same principle of look ahead carry calculation and preserving the aforementioned two steps.

Another object is to reduce the number of ports and logic layers in the device.

Another object is to adapt this device so that it can be implanted in a regular "data path" type of structure.

Another object is to merge the carry look ahead block with the parity calculation block of the prior art.

This invention furthermore makes it possible to simplify the structure of the carry look ahead adder.

The invention shares the finding that the input carry bit $c_{in}$ of the adder, which is a bit that participates in the addition and originates for example in another adder or serves to modify the function achieved, is available even before the beginning of the calculations, unlike the input carry bits corresponding to the other groups of bits of operands, which are attained only in the course of the calculation. Consequently, the circuits tasked with calculating the parity bit associated with the group formed of the least significant bits of the result can cause this input carry bit to intervene quite early in the course of the operations, without slowing down the device. These circuits can accordingly have a simplified structure compared with circuits tasked with calculating the parity bits associated with the other groups. It will be seen that the consequence of this simplification is that the input carry bits $c_{i,1}$ for the other groups can be deduced quite simply, without requiring separate prediction circuits.

Accordingly, the subject of the invention is a device for calculating the K parity bits ($PS_i$) associated respectively with K groups of m consecutive bits extracted from the result (S) of the addition of two binary numbers (A, B), said numbers (A, B) each including at least K groups of m bits, K being at least equal to two, the addition generating a carry word (C), the groups extracted from said numbers (A, B, C, S) being formed respectively of bits $a_{i,m}, \ldots, a_{i,j}, \ldots, a_{i,2}, a_{i,1}, b_{i,m} \ldots, b_{i,j}, \ldots, b_{i,2}, b_{i,1}, c_{i,m}, \ldots, c_{i,j}, \ldots, c_{i,2}, c_{i,1},$ and $s_{i,m}, \ldots, s_{i,j}, \ldots, s_{i,2}, s_{i,1}$, in which the subscript i indicates one of the K groups, the groups extracted from each number (A, B, C, S) constituted by the m least significant bits being designated by a subscript i=1, and the subscript j indicating the significance in the group of the bit associated, $c_{1,1}$ being the input carry bit intervening in the addition, the device including at least two circuit stages (10', 50'), each stage receiving at the input a plurality of groups of bits extracted from the operands or intermediate signals calculated from the operands, one stage being placed downstream of the other in the direction of signal transmission in the device, each stage performing a separate step in the calculation of the parities PSi associated with the groups of the result, characterized in that the first stage (10') placed upstream of the device uses the value of the input carry bit $c_{1,1}$ corresponding to the group made up of the m least significant bits, but not the value of the other input carry bit $c_{i,1}$ (for i=[2, 3, ..., K]) corresponding to the other groups, and that said values of the other carry bits intervene only in a second stage (50') placed farther downstream of the device.

In another characteristic, the object of the invention is a device including a third stage (60) to which intermediate signals ($p_{i,j}$, $g_{i,j}$) originating in said first stage are applied, and applying to said second stage other intermediate signals ($X_i$, $Y_i$) for calculating the parity bits $PS_i$ associated with the groups of the result, the value of the other input carry bits ($c_{i,1}$) (for i=[2, 3, ..., K]) for groups other than the group composed of the m least significant bits being calculated in this third stage.

In another characteristic, the object of the invention is characterized in that each group of subscript i extracted from the numbers (A, B) is associated with a respective parity bit $PA_i$ and $PB_i$, and that said device includes:

one said first stage (10') for calculating the following values, given (i=1):

$$g_{1,1} = a_{1,1} \cdot b_{1,1} + a_{1,1} \cdot c_{1,1} + b_{1,1} \cdot c_{1,1}$$
$$g_{1,j} = a_{1,j} \cdot b_{1,j} \quad \text{for } (j = [2,3,\ldots,m])$$
$$p_{1,j} = a_{1,j} \oplus b_{1,j} \quad \text{for } (j = [2,3,\ldots,m])$$

a first operator (60a) belonging to said third stage for calculation, given (i=1) for (j=[2, 3, ..., m]), the values $G_{i,j}$ that verify the following recurrent logic equations:

$$G_{1,j} = g_{1,j} + p_{1,j} \cdot G_{1,j-1}$$

with $$G_{1,1} = g_{1,1},$$

a second operator (60b) belonging to said third stage for calculation with (i=1):

$$Y_1 = G_{1,1} \oplus G_{1,2} \oplus \ldots \oplus G_{1,j} \oplus \ldots \oplus G_{1,m-1} \oplus PA_1 \oplus PB_1$$

where the value $Y_1$ is equal to the parity associated with the group of m least significant bits extracted from the result.

In another characteristic, the object of the invention is a device characterized in that:

said first stage (10') further for each pair (i, j) calculates the following values, given (i=2, 3, ..., K]) and j=[1, 2, ..., m]:

$$p_{i,j} = a_{i,j} \oplus b_{i,j}$$
$$g_{i,j} = a_{i,j} \cdot b_{i,j}$$

said first operator (60a) belonging to said third stage further calculates, for each pair (i, j), given (i=[2, 3, ..., K]) and (j=[2, 3, ..., m]), the values $G_{i,j}$ and $P_{i,j}$ that verify the following recurrent logic equations:

$$G_{i,j} = g_{i,j} + p_{i,j} \cdot G_{i,j-1}$$

with $$G_{i,1} = g_{i,1},$$
$$P_{i,j} = p_{i,j} \cdot P_{i,j-1}$$

with $$P_{i,1} = p_{i,1}$$

said second operator (60b) belonging to said third stage further calculates the following, for (i=[2, 3, ..., K]):

$$Y_i = G_{i,1} \oplus G_{i,2} \oplus \ldots \oplus G_{i,j} \oplus \ldots \oplus G_{i,m-1} \oplus PA_i \oplus PB_i$$

$$X_i = P_{i,1} \oplus P_{i,2} \oplus \ldots \oplus P_{i,j} \oplus \ldots \oplus P_{i,m-1}$$

where the parity associated with the groups of m bits extracted from the result other than the group formed of the M least significant bits is then calculated by a third operator (50) belonging to said second stage with the aid of the following relationship:

$$PS_i = Y_i \oplus c_{i,1} \cdot X_i^*$$

for (i=[2, 3, ..., K])
where $c_{i,1}$ is the least significant carry bit of the group of subscript i, and where $X_i^*$ is the complement of $X_i$.

In another characteristic of the invention, the least significant carry bit $c_{i,1}$ for (i=[2, 3, ..., K]) used by said operator for groups other than the least significant group is determined in said first operator:

for (i=2) as being equal to the values $G_{1,m}$ calculated from the group made up of the m least significant bits, for (i=[3, 4, ..., K]), by applying to the inputs of a module of a third type (M3) the outputs $P_{i-1,m}$ and $G_{i-1,m}$ originating from the first operator and the input carry bit $c_{i-1,1}$ of the next-lower significance group, the output of the module M3 furnishing the value:

$$c_{i,1} = G_{i-1,m} + P_{i-1,m} \cdot c_{i-1,1}.$$

In another characteristic of the invention, the portion of the first operator tasked with processing the groups made up of the m least significant bits uses modules of a first type M1 and modules of a third type M3, the modules of a first type operating on four inputs Px, Gx, Py, Gy and furnishing two outputs Pz, Gz, linked to the inputs by the following relationships:

$$P_z = Py \cdot Px$$

$$G_z = Gy + Py \cdot Gx,$$

wherein the modules of a third type operate on three inputs Px, Gx and cy and furnish and output cz verifying the following relationship:

$$cz = Gx + Px \cdot cy$$

where said modules are mounted in accordance with the following recurrent method:

a) for j=1, $G_{1,1} = g_{1,1}$ is obtained directly;

b) for j=2, a first module M3 (1') operates on $p_{1,2}$, $g_{1,2}$ and $g_{1,1}$ and furnishes $G_{1,2}$;

c) for j between 3 and 4, a second module M1 (2') operates on $p_{1,3}$, $g_{1,3}$ and $p_{1,4}$, $g_{1,4}$, a third module M3 (3') operates on $G_{1,2}$ and $p_{1,3}$, $g_{1,3}$ and furnishes $G_{1,3}$, a fourth module M3 (4') operates on $G_{1,2}$ and the outputs of the second module (2') and furnishes $G_{1,4}$;

d) once the initial assembly is made for j with values between 1 and $2^n$, the assembly for j between $2^n+1$ and $2^{n+1}$ is obtained adding modules M1 disposed in accordance with the initial assembly but offset by $2^n$ rows toward the most significant bits, thus furnishing new outputs, $2^n$ additional outputs of the third type (M3) being available for operating on the most significant outputs $G_{1,2^n}$ originating in the initial assembly and at each of the new outputs, respectively.

In another characteristic of the invention, the portion of said second operator (61b) tasked with processing the groups made up of the m least significant bits is made up of logic gates of the "EXCLUSIVE-OR" type disposed in a tree which at its input receives the outputs $G_{1,j}$ through $G_{1,m-1}$ of the first operator, the parities PA1 and PB1 associated with the groups of operands made up of the m least significant bits, and the input carry bit $c_{1,1}$, these signals being taken two by two as much as possible, and the logic gates being disposed in such a way as to calculate the following:

$$Y_1 = PA1 \oplus PB1 \oplus c_{1,1} \oplus G_{1,1} \oplus G_{1,2} \oplus \ldots \oplus G_{1,j} \oplus \ldots \oplus G_{1,m-1}.$$

In another characteristic of the invention, this first stage (10') may be common to or separate from the adder associated with this device.

BRIEF DESCRIPTION OF THE DRAWINGS

Further characteristics and advantages will becomes apparent from the ensuing description, given by way of example and illustrated by the accompanying drawings.

DETAILED DESCRIPTION OF THE PREFERRED EMBODIMENTS

Figure 1:
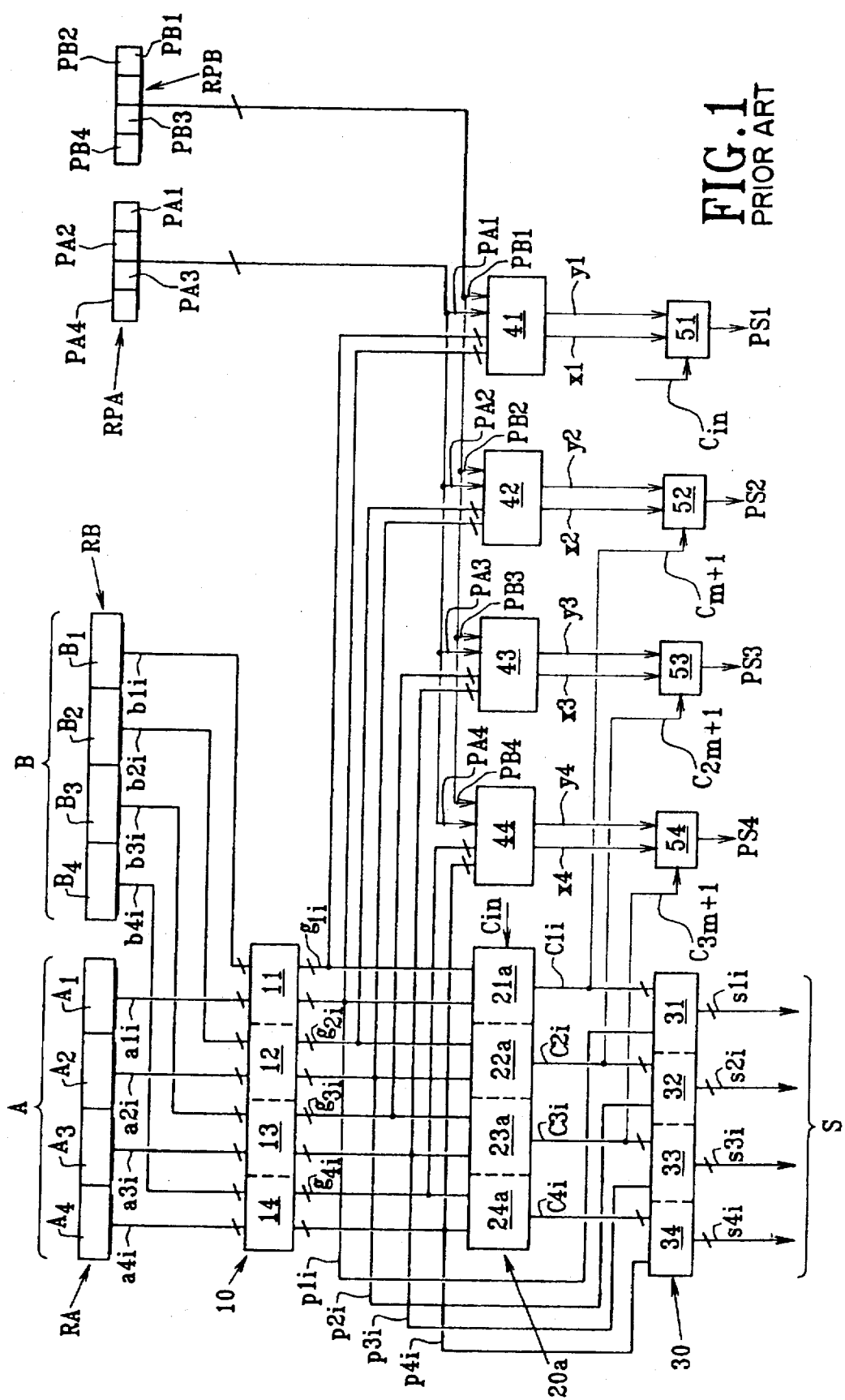
FIG. 1 is a schematic diagram of an array including an adder and a device for calculating parity bits, of the prior art.

In the entire description, the same elements in the various drawing figures will be identified by the same reference symbols.

Before the invention is described in conjunction with the drawings, the theoretical bases of the invention should be discussed. In the entire description, the reader is invited to turn to the aforementioned Patent EP 329 545, which in detail describes a prior art that will be recalled here more succinctly.

In a general way, the calculation of the sum of two numbers A and B of N bits respectively made up of the bits $a_N, a_{N-1}, \ldots, a_i, \ldots, a_2, a_1$ and $b_N, b_{N-1}, \ldots, b_i, \ldots, b_2, b_1$ generates a carry word C formed of carry bits $c_i$ and a sum S formed of bits $f_i$. Let us now consider groups formed of m consecutive bits extracted from the numbers A, B, C and S and made up respectively of the bits $a_{i,j}$, $b_{i,j}$, $c_{i,j}$, $s_{i,j}$. Here, i is the group subscript, and the group with the subscript 1, sometimes hereinafter referred to as the least significant group, is made up of m least significant bits of the word, and j indicates the significance of the bit within its group.

In terms of specific notation, the operation done when two peer groups Ai and Bi corresponding to operands A and B are added, the group for this example having a size m=4 bits, will be written as follows:

$$c_{i,5}\ c_{i,4}\ c_{i,3}\ c_{i,2}\ c_{i,1}$$
$$a_{i,4}\ a_{i,3}\ a_{i,2}\ a_{i,1}$$
$$+\ \underline{b_{i,4}\ b_{i,3}\ b_{i,2}\ b_{i,1}}$$
$$s_{i,4}\ s_{i,3}\ s_{i,2}\ s_{i,1}$$

where $c_{i,1}$ being the input carry of group i. For the group made up of the m least significant bits (i=1), $c_{1,1}$ is equal to the input carry bit in the adder, that is, $c_{in}$. The carry bit $c_{i,5}$ is equal to the input carry bit $c_{i+1,1}$ of the group of next-higher significance. For the group made up of the m high significance bits, $c_{i,5}$ is equal to the overflow variable of the adder.

Hereinafter, the subscripts of group i will not be mentioned except when necessary.

When this will facilitate comprehension without adding ambiguity, the subscripts will no longer refer to the significance of the bits within a group of m bits but rather to their significance within the complete word formed by the juxtaposition of all the groups. To designate the $j_{th}$ bit of the $i^{th}$ group of the variable x will be written either as $x_{i,j}$ or as $x_{(i-1)m+j}$. For example, if the groups have a size m=8 bits, then the third bit of the third group of operand A will be designated by whichever subscript is more explicit, either $a_{2,3}$ or $a_{11}$. If the appearance of a particular group is not significant, then it will be written as $a_{i,3}$, or simply as $a_3$.

A known type of adder uses a carry word look ahead circuit. Adders of this type include a first stage that forms intermediate variables $p_j$ and $g_j$ calculated from the bits $a_j$, $b_j$ of the two numbers A and B in accordance with the following equations:

$$p_j = a_j \oplus b_j$$

$$g_j = a_j \cdot b_j$$

where $\oplus$ designates the "EXCLUSIVE-OR" operation.

The bit of significance j in the sum is obtained from the carry bit $c_j$ of significance j by the following equation:

$$s_j = p_j \oplus c_j$$

On the other hand, $$c_j = g_{j-1} \oplus p_{j-1} \cdot c_{j-1}$$

where $$c_1 = c_{in}$$

Hence the carry bits can be calculated step by step from the variables $p_j$, $g_j$ which depend only on the bits $a_j$, $b_j$ of the operands. This calculation is done by the carry look ahead circuit, which will be described hereinafter. The adder then includes a final stage for calculating the bits $s_i$ of the sum S, which are obtained by the formula $$s_j = p_j \oplus c_j.$$

Let us now consider groups formed of consecutive bits extracted from the numbers A, B and C and made up respectively of the bits $a_j$, $b_j$ and $c_j$, where j indicates the significance of the bit in its group. By designating the least significant carry bit in the group of subscript i as $c_{i,1}$, it can be demonstrated that if j is greater than 1, $$c_{j+1} = G_j + P_j \cdot c_{i,1}$$

where $P_j$ and $G_j$ are defined by the following recurrent formulas:

$$P_j = p_j \cdot P_{j-1}$$

where $$P_1 = p_1$$

$$G_j = g_j + p_j \cdot G_{j-1}$$

$$G_1 = g_1$$

Figure 3:
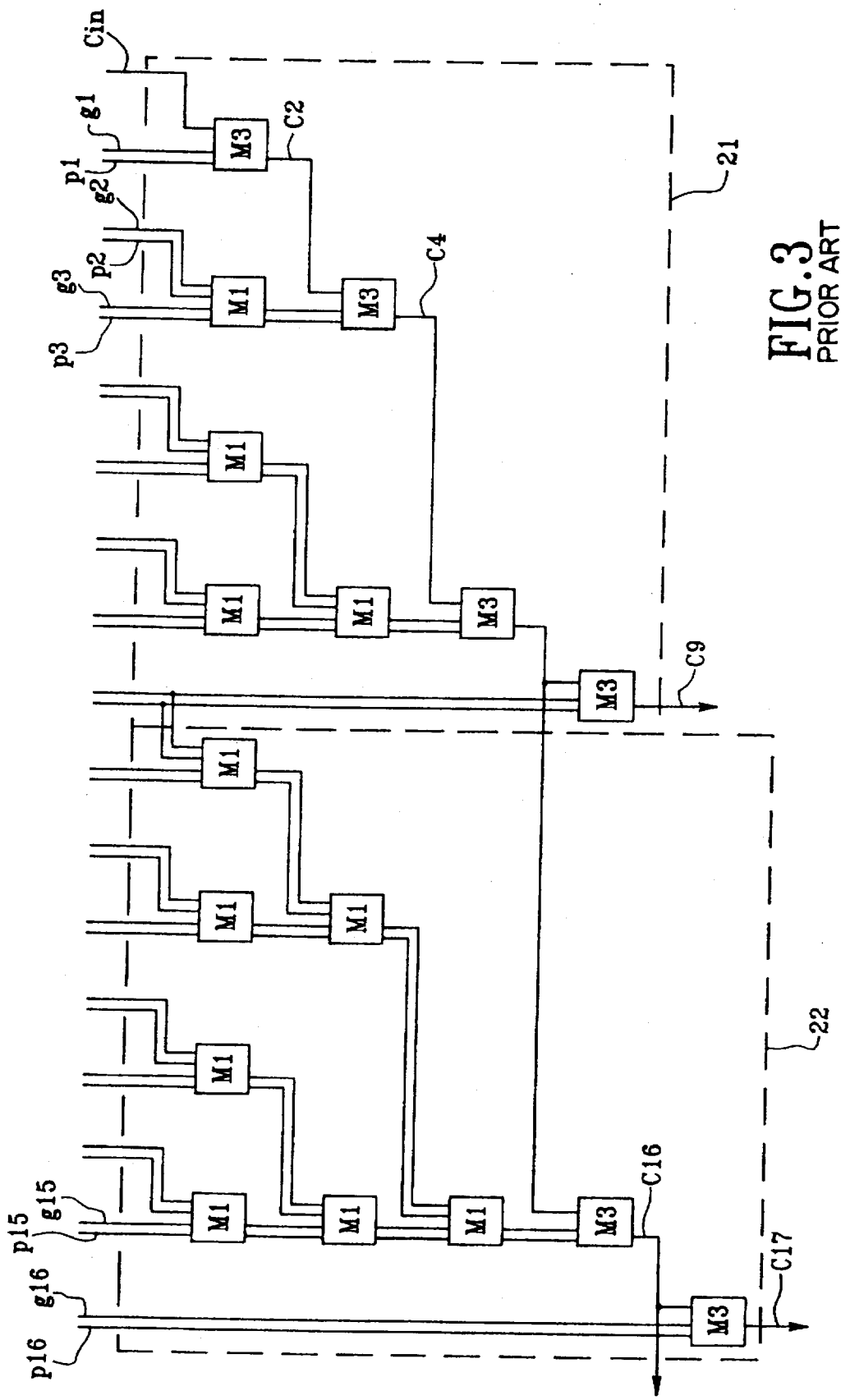
FIG. 3 shows a carry bit look ahead circuit in a particular embodiment of the prior art.

These formulas make it possible to construct a carry look ahead circuit that has a reduced number of cascade-connected logic circuits. This will be recalled hereinafter in conjunction with FIG. 3 showing the prior art.

Turning now to the problem of parity bits, it has been seen that the numbers are in general considered to be formed of a plurality of groups of m bits of the same size, and that one parity bit is associated with each group.

Hence the operands A and B, the carry bit C and the sum S are made up respectively of groups A1, A2, A3, A4; groups B1, B2, B3, B4; groups C1, C2, C3 and C4; and groups S1, S2, S3, S4. One parity bit, for example $PA_i$, is associated with each group, such as Ai.

In the ensuing discussion, as to the parity bits, only the peer groups comprising the operands, the carry bit and the sum will be considered, that is, the groups made up of bits of the same significance.

If the parity bits associated with the respective peer groups drawn from the numbers A, B and S are designated as $PA_i$, $PB_i$, $PS_i$, then it is easy to demonstrate that the following relationship applies:

$$PS_i = PA_i \oplus PB_i \oplus PC_i$$

where $$PC_i = c_{i,m} \oplus \ldots \oplus c_{i,j} \oplus \ldots \oplus c_{i,2} \oplus c_{i,1}.$$

$PC_i$ is the parity bit associated with the group of subscript i extracted from the word formed of the carry bits intervening at the time of the addition. To obtain $PC_i$ by the above formula, it is apparent that all the carry bits must be available.

However, theoretical calculations show that $PC_i$ can occur in the following form:

$$PC_i = Y_i \oplus c_{i,1} \cdot X_i^*$$

where $c_{i,1}$ is the least significant carry bit of the group of subscript i, and where $X_i^*$ is the complement of $X_i$, where:

$$Y_i = G_{i,1} \oplus G_{i,2} \oplus \ldots \oplus G_{i,j} \oplus \ldots \oplus G_{i,m-1}$$

$$X_i = P_{i,1} \oplus P_{i,2} \oplus \ldots \oplus P_{i,j} \oplus \ldots \oplus P_{i,m-1}$$

and where the variables $P_{i,j}$ and $G_{i,j}$ verify the following recurrent formulas:

$$P_{i,j} = p_{i,j} \cdot P_{i,j-1} \quad (1)$$

where $$P_{i,1} = p_{i,1}$$

$$G_{i,j} = g_{i,j} + p_{i,j} \cdot G_{i,j-1} \quad (2)$$

$$G_{i,1} = g_{i,1}$$

For the group made up of the m least significant bits of the word, $c_{1,1} = c_{in}$. When a normal addition, without an input carry bit, is performed, then $c_{in}=0$. The input carry bit $c_{in}$ becomes 1, for example, in the case of incrementation or where the adder is used to perform subtraction. In effect, performing the subtraction operation A−B is equivalent to calculating A+B*+1, where B* is the complement of B. The use of the above formulas in the prior art will now be described in further detail, referring to the above patent EP 329 545.

FIG. 1 shows an adder associated with a parity bit generator of the prior art.

By way of example, it has been assumed that the numbers A and B to be added are made up of four 8-bit groups, respectively A1, A2, A3, A4 and B1, B2, B3, B4. Each group is associated with one corresponding parity bit. For example, group A1 is associated with the parity bit $PA_1$; group A2 is associated with the parity bit $PA_2$; etc.

The operands A and B as well as the parity bits associated with these two operands are contained in respective registers RA, RB, RPA and RPB.

Two peer groups extracted from the operands will now be considered, for example A1 and B1. The group A1 is made up of m bits $a_{1,i}$, and the group B1 is made up of m bits $b_{1,i}$. The bits of the same significance, $a_{1,i}$ and $b_{1,i}$, are combined in an operator 11 that includes "EXCLUSIVE-OR" and "AND" circuits so as to calculate the following variables:

$$p_{1,i} = a_{1,i} \oplus b_{1,i}$$

$$g_{1,i} = a_{1,i} \cdot b_{1,i}$$

The circuits 12, 13, 14 associated with the other groups are identical to the circuit 11, all of these circuits forming the first stage 10 of the adder.

A carry look ahead circuit 20a receives at its input the outputs of the first stage 10. The circuit 20a enables calculation of all the carry bits $c_{1,i}$, $c_{2,i}$, $c_{3,i}$, and $c_{4,i}$ involved in the addition of the two operands. This circuit 20a may be conceived of of being made of a plurality of circuits 21a, 22a, 23a and 24a, respectively associated with the groups of which the operands are formed.

A final "EXCLUSIVE-OR" stage 30 receives at its input the outputs of the first stage 10. The circuit 30 furnishes at its output the bits $s_{1,i}$ through $s_{4,i}$ of the result S of the addition. The circuit 30 may also be conceived of as being made up of a plurality of circuits 31, 32, 33, 34 associated respectively with the groups of which the operands are formed. Hence the circuit 31 furnishes the bits $s_{1,i}$ of the least significant group verifying the following equation:

$$s_{1,i} = p_{1,i} \oplus c_{1,i}$$

The above relates solely to the adder, and the portion of the circuit that relates to the parity generator of the prior art will now be described. The parity generator in this example includes an array made up of four operators 41, 42, 43 and 44, receiving respectively the parity bits of the peer groups of the operands, and the variables emitted by the first stage 10. For example, the operator 41 associated with the least significant group receives the parity bits $PA_1$, $PB_1$ and the variables $p_{1,i}$ and $g_{1,i}$ originating in the circuit 11. As a function of these signals, the operator 41 furnishes the two variables $X_1$ and $Y_1$ that verify the equations discussed above.

Analogously, the circuits 42, 43, 44 respectively deliver the variables $X_2$, $Y_2$; $X_3$, $Y_3$; $X_4$, $Y_4$.

A final stage made up of operators 51, 52, 53 and 54 receives the variables $X_i$, $Y_i$ of the corresponding group, as well as a carry signal dependent on the group in question. More precisely, the operator 54 receives the carry bit $c_{3m+1}$ originating in the circuit 23a, which is the least significant carry bit of the group whose subscript is i=4. The operator 53 receives the carry bit $C_{2m+1}$, which is the least significant carry bit of the group whose subscript is i=3, the operator 52 receives the carry bit $C_{m+1}$, which is the least significant carry bit of the group whose subscript is i=2. The operator 51 receives the input carry bit $c_{in}$.

In general, by designating the carry bit applied to the corresponding operator with the symbol $c_{i,1}$, each operator furnishes an output signal $PS_1 \ldots PS_4$ verifying the equation $$PS_i = Y_i \oplus c_{i,1} \cdot X_i^*.$$

The variables $PS_1$–$PS_4$ thus obtained are accordingly the parity bits associated with each of the groups extracted from the sum.

Stages 10 and 30 of the adder are made up of conventional logic circuits of the "AND" and "EXCLUSIVE-OR" type.

One skilled in the art is competent to embody them and they will not be described here in detail.

The operators 41–44 and the carry look ahead circuit 20a are difficult to integrate in CMOS technology using the "data path" method. One of the major advantages of the invention with respect to this version is the simplification and merging of these functional blocks. In order that the advantages gained will be well understood and also for better comprehension of the function of the invention, the function of these operators will now be explained, even though they belong to the prior art, in conjunction with FIGS. 2 and 3.

Since in this embodiment the operators 41–44 are identical, it will suffice to describe only one of them, for example the operator 41. To assure general applicability, this entire portion of the description will be made by subscripting the various variables with the group subscripts i, where i has the value of 1 in the case of the variables processed by the operator 41. The relationships mentioned in this section can accordingly readily be generally stated for the values i=[1, 2, ..., m].

Figure 2:
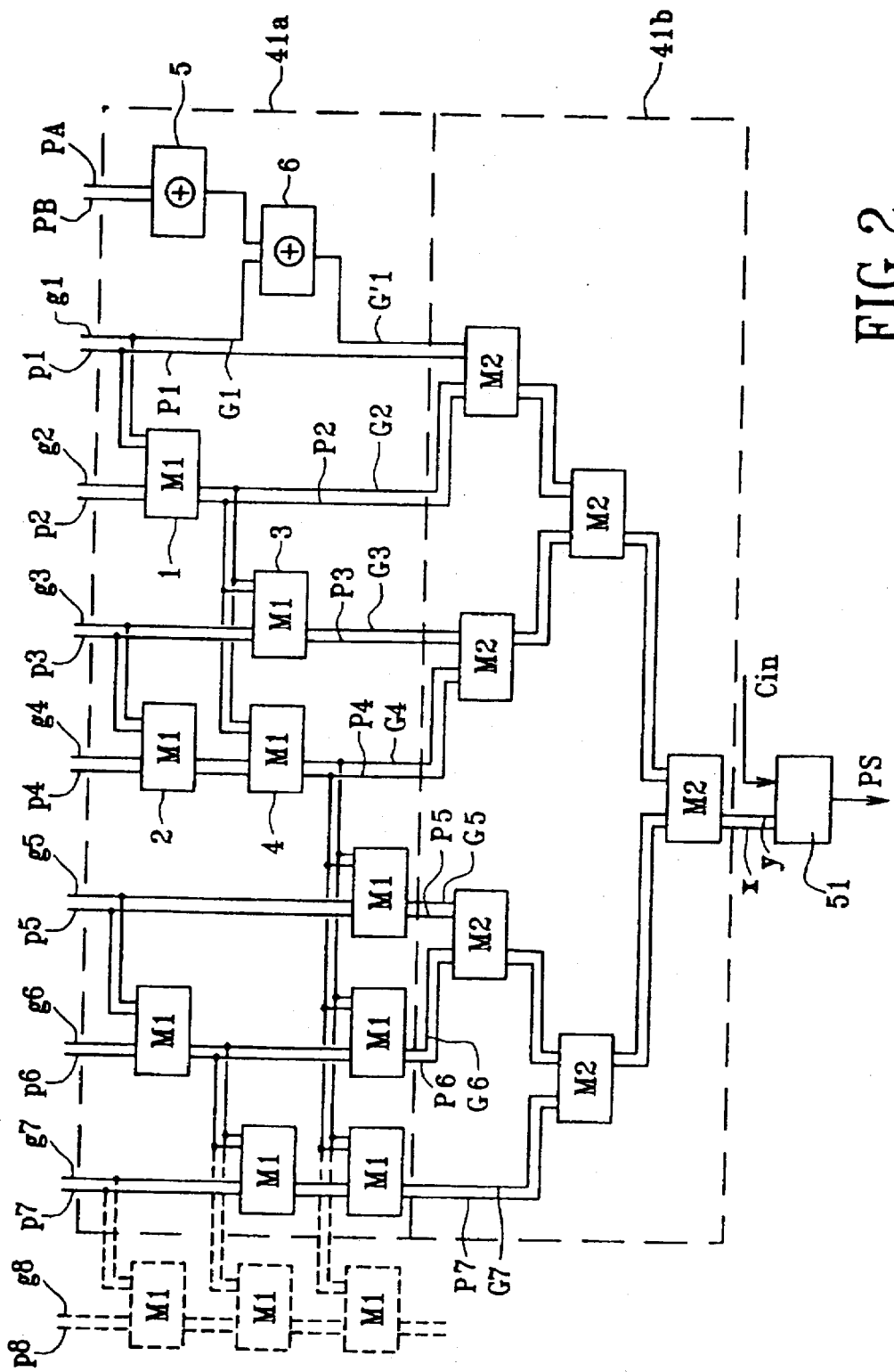
FIG. 2 shows a device for calculating the parity bit associated with a group of eight bits extracted from a sum of two binary numbers according to the prior art.

FIG. 2 shows an element 41 of the circuit that enables calculating the parity bit associated with the group made up of the eight least significant bits of the result of an addition of two numbers. It will be understood that the ensuing description is not limited to this particular case, and that the circuit could be generalized for any number of bits.

The circuit of FIG. 2 includes a first operator 41a receiving the variables $p_{1,1}$, $g_{1,1}$ through $p_{1,7}$, $g_{1,7}$ calculated by the circuit 11 described above, or by a separate or identical circuit. This circuit 11 may in fact be in common with the adder, but to improve the integrity of the circuit it is preferable to use a circuit 11 independent of the adder, because using a common circuit 11 would mask the errors that could arise in that circuit.

The operator 41a is made up exclusively of logic modules of a first type M1, which at the input receive four binary variables $P_x$, $G_x$, $P_y$ and $G_y$ and furnishing two binary output variables $Pz$, $Gz$ that verify the following equations:

$$P_z = P_y \cdot P_x$$

$$G_z = G_y + P_y \cdot G_x$$

Figure 7:
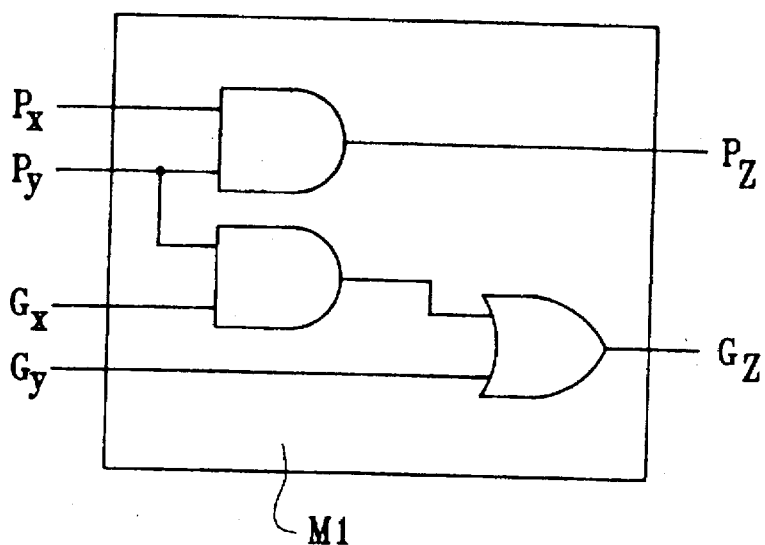
FIG. 7 shows a module M1 used in the invention.

FIG. 7 shows one exemplary embodiment of a module M1 using logic elements of the "AND" and "OR" type. It will be appreciated that other embodiments, for example using elements of the "NAND", "NOR", "EXCLUSIVE-NOR" type adapted to CMOS technology are within the competence of one skilled in the art.

The use of these modules and their availability will enable calculating the variables $P_{i,j}$ and $G_{i,j}$, for (j=[1, 2, ..., 7]), defined by the following recurrence relations:

$$P_{i,j} = p_{i,j} \cdot P_{i,j-1}$$

where $$P_{i,1} = p_{i,1}$$

$$G_{i,j} = g_{i,j} + p_{i,j} \cdot G_{i,j-1}$$

where $$G_{i,1} = g_{i,1}$$

The relation that links the pair of output variables $P_z$, $G_z$ to the two pairs of input variables $P_x$, $G_x$ and $P_y$, $G_y$ has the valuable property of being associative. Because of this property, it is possible for the modules M1 to be available in such a way as to calculate the variables $P_{i,j}$ and $G_{i,j}$ while minimizing the number of layers of this circuit, or in other words the number of these modules connected in cascade.

The way in which the first operator 41a is constructed, by a recursive method, is described in the aforementioned patent EP 329 545.

If j=1, then the following are obtained directly: $P_{i,1}=p_{i,1}$ and $G_{i,1}=G_{i,1}$. If j=2, then $p_{i,1}$, $g_{i,1}$ is further combined with $p_{i,2}$, $g_{i,2}$ in a first module 1, which at its output furnishes $P_{i,2}$, $G_{i,2}$. If j=3, a third module 3 combines $p_{i,3}$, $g_{i,3}$ with $P_{i,2}$, $G_{i,2}$ originating in the first module 1. This module 3 furnishes $P_{i,3}$, $G_{i,3}$. If j=4, another module 2 combines $p_{i,3}$, $g_{i,3}$ and $p_{i,4}$, $g_{i,4}$, and the output of this module 2 is combined in another module 4 with the output of module 1. This module 4 furnishes $P_{i,4}$, $G_{i,4}$. This result is indeed obtained thanks to the associativity of the function performed by the module M1.

To complete the construction of the operator 41a for j greater than 4, it suffices to pursue the following method:

Once the initial assembly is made for j with values between 1 and $2^n$, the assembly for j between $2^n+1$ and $2^{n+1}$ is obtained adding modules M1 disposed in accordance with the initial assembly but offset by $2^n$ rows toward the most significant bits, thus furnishing new outputs. $2^n$ additional modules M1 then available, which combine the most significant outputs $P_{i,2n}$, $G_{i,2n}$ originating in the initial assembly and at each of the new outputs, respectively.

The construction will stop at the m−1 order. All the values of the variables $p_i$ and $g_i$ will then be available. In the example in question, variables $P_{i,j}$, $G_{i,j}$ up to the order of 7 will accordingly be available at the output of the first operator 41a.

The outputs $P_{i,j}$, $G_{i,j}$ of the operator 41a are then applied to the inputs of the second operator 41b.

The operator 41b is made up of logic modules of a second type M2, which are simply double "EXCLUSIVE-OR" circuits with four inputs $X_x$, $Y_x$, $X_y$, $Y_y$ and furnishing two outputs $X_z$, $Y_z$ verifying the equations:

$$X_z = X_x \oplus X_y$$

$$Y_z = Y_x \oplus Y_y$$

Figure 8:
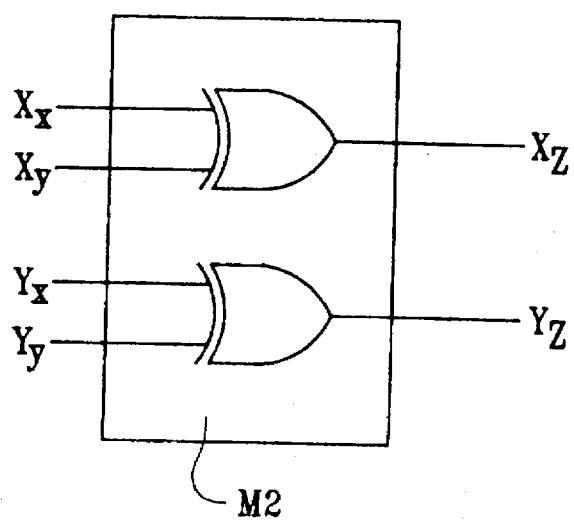
FIG. 8 shows a module M2 used in the invention.

FIG. 8 shows an exemplary embodiment of a module M2 with the aid of "EXCLUSIVE-OR" logic elements. Once again, other versions based on elements better adapted to a particular technology are within the competence of one skilled in the art.

One can immediately see that it suffices to have these modules M2 available in an inverted pyramid construction, which is equivalent to an "EXCLUSIVE-OR" operator with multiple inputs. This assembly thus makes it possible to obtain the two variables X and Y defined by the following relationships:

$$Y_i' = G'_{i,1} \oplus G_{i,2} \oplus \ldots \oplus G_{i,j} \oplus \ldots \oplus G_{i,m-1}$$

$$X_i = P_{i,1} \oplus P_{i,2} \oplus \ldots \oplus P_{i,j} \oplus \ldots \oplus P_{i,m-1}$$

where $G'_{i,1}$ is calculated from the relationship $$G'_{i,1} = PA_i \oplus PB_i \oplus G_{i,1}.$$

The reason for introducing $PA_i$, $PB_i$ into the calculation of $Y_i'$ will be understood hereinafter.

The variables $X_i$, $Y_i'$ and the carry bit $C_{i,1}$ (for i=1, $C_1 = c_{in}$) defined above are applied to the third operator 51, whose output $PS_i$ is linked to the inputs by the following logical equation:

$$PS_i = Y_i' \oplus c_{i,1} X_i^*$$

where $X_i^*$ is the complement of $X_i$.

If a magnitude $PC_i$ is defined by the following relation:

$$PC_i = c_{i,1} \oplus c_{i,2} \oplus \ldots \oplus c_{i,j} \oplus \ldots \oplus c_{i,m}$$

then $$PS_i = PA_i \oplus PB_i \oplus PC_i,$$

that is, the parity of the result of an addition to two binary numbers is equal to the EXCLUSIVE-OR sum of the parity of the carry word and the respective parities of the two operands of the addition. The above circuit in which $G_{i,1}$ has not been replaced by $G'_{i,1}$ would then at its output furnish the parity of the carry word instead of the parity of the result. It would also be possible to replace any of the outputs $G_{i,j}$ of the first operator with the expression $$PA_i \oplus PB_i \oplus G_{i,j}.$$

Another solution would be to replace any two outputs $G_{i,j}$ and $G_{i,k}$ of the first operator with the result of the operations $PA_i \oplus G_{i,j}$ and $PB_i \oplus G_{i,k}$, respectively. All this is described in great detail in the aforementioned patent.

FIG. 3 represents a look ahead circuit for carry bits specific to the parity generator of the prior art. It furnishes carry bits of order $c_9$, $c_{17}$ and $c_{25}$ serving as inputs to the circuit 52, 53 and 54, respectively, of the third stage, or in other words the variables $C_{2,1}$, $C_{3,1}$ and $C_{4,1}$. Since in the invention this circuit has become useless, the description of its function, which is explained in detail in the aforementioned patent, is not repeated here.

The solution of the prior art described thus far has the disadvantage, besides its complexity, of being difficult to implement in CMOS technology. In particular, physical implantation in a regular "data path" type of structure is far from being optimal. The various logic blocks used with this type of implantation must all have the same width along one data path, and the width depends on the number of bits in the path. For example, a path may be made up of a 32-bit register, followed by a 32-bit stack, and then a 32-bit incrementer. When these various blocks all have the same width, implantation by superposition can be done highly advantageously in terms of the surface area of silicon used and the lengths of the interconnections.

The circuit shown in FIG. 1 is very difficult to implant in this type of structure, however, unless it is given an exaggerated height, making for interconnection lengths that are incompatible with the requirement for high-speed processing.

Figure 4:
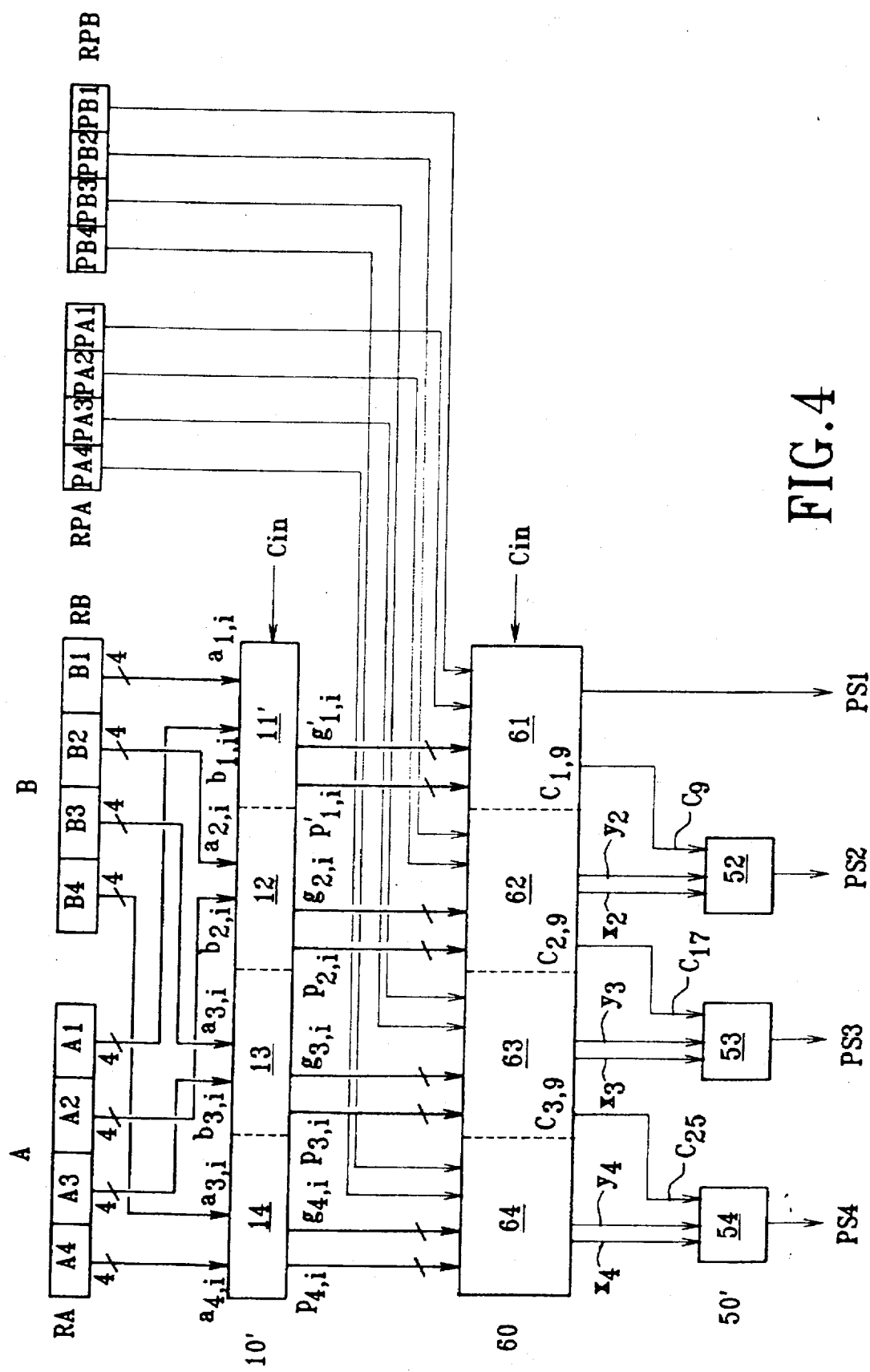
FIG. 4 is a schematic diagram of the array including an adder and a parity bit calculation device according to the invention.
Figure 5:
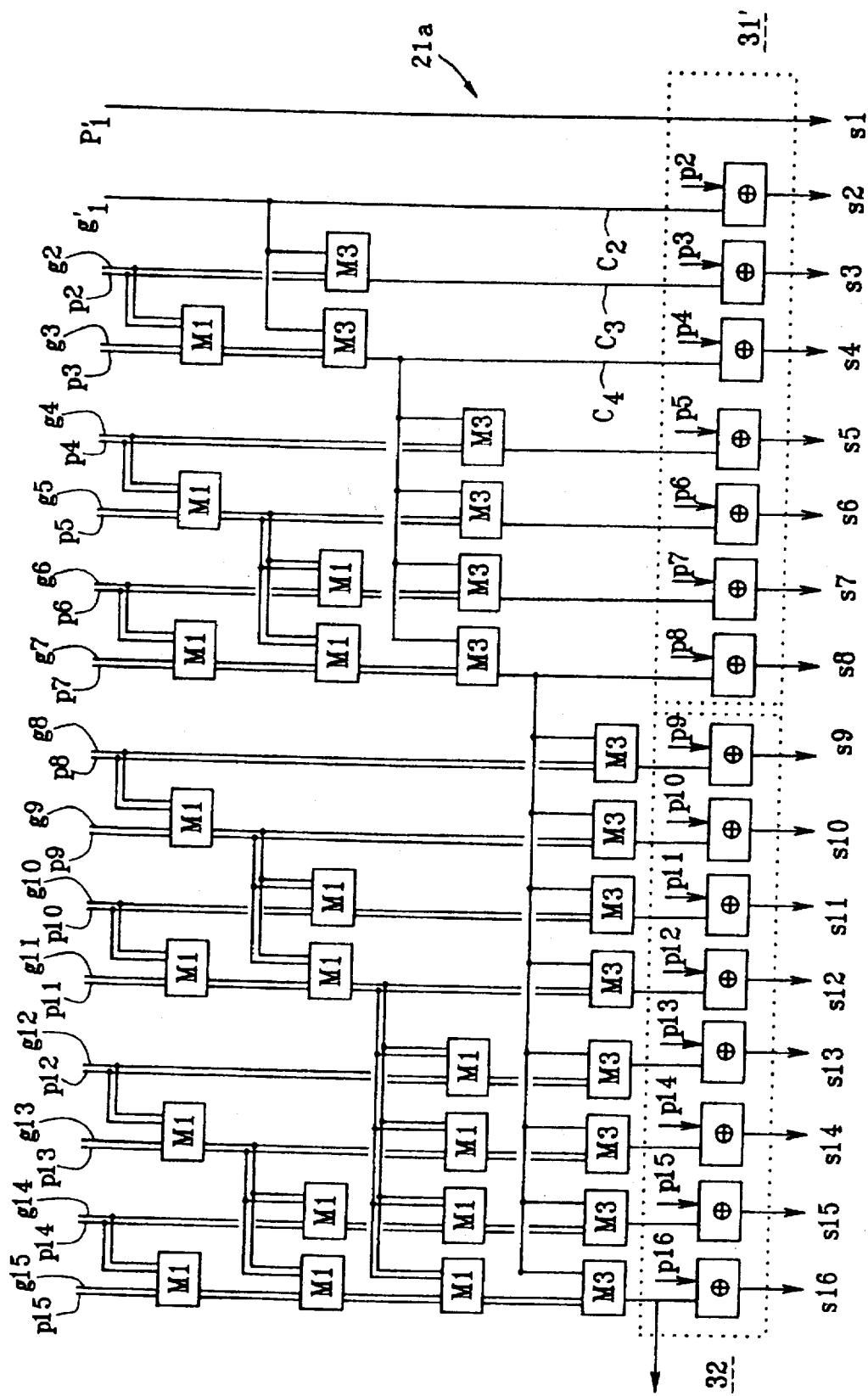
FIG. 5 shows a modified adder circuit according to the invention.
Figure 6:
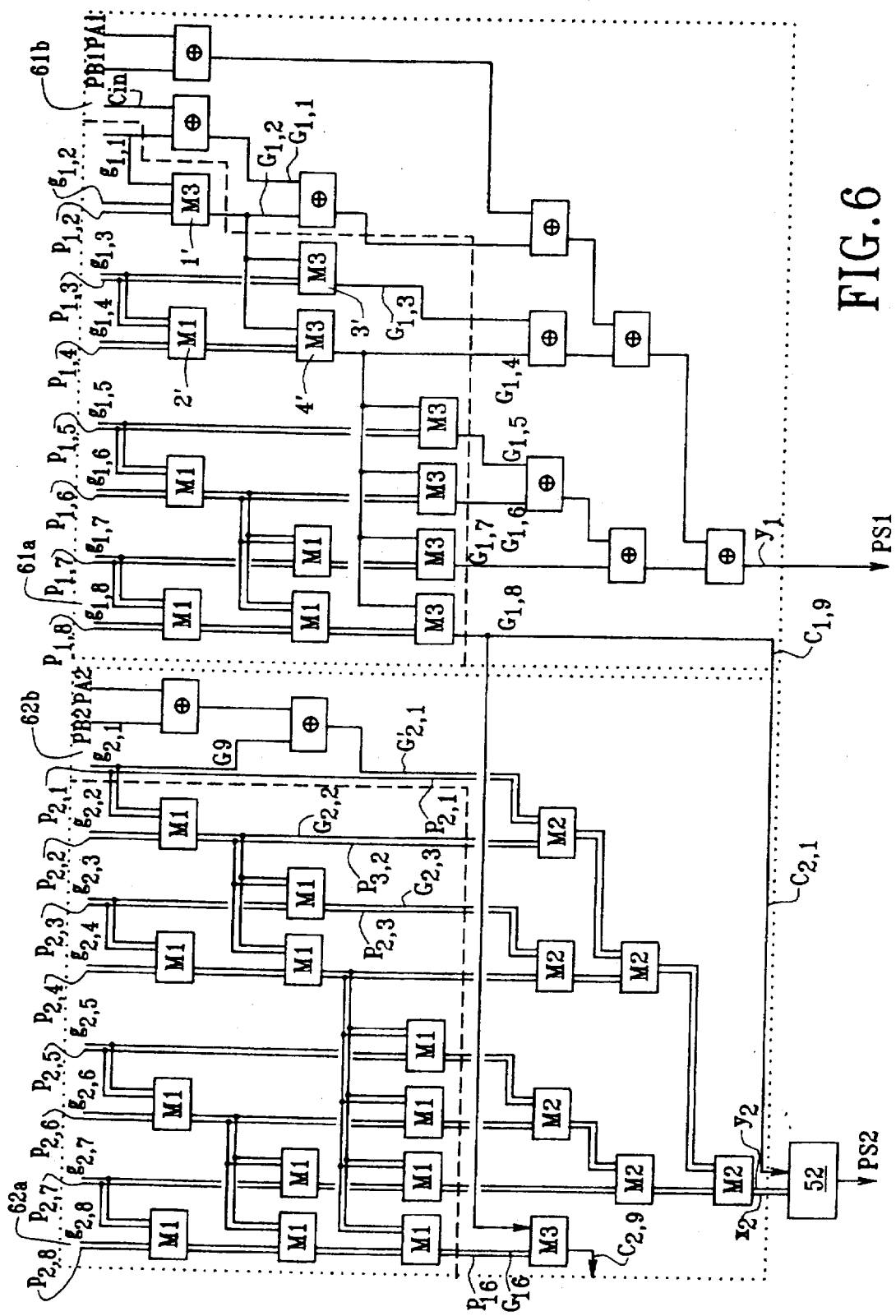
FIG. 6 shows a circuit for calculating two parity bits associated with two groups of eight least significant bits extracted from the sum of two binary numbers, according to the invention.

This problem, and the problem of the complexity of the device described above, are solved by the circuit described now in conjunction with FIGS. 4–6.

For the operators on the group of data made up of the m consecutive least significant bits ($A_1$, $B_1$, $C_1$ and $S_1$), designated as the least significant group, the carry bit $c_{1,1}$ is available even before the beginning of calculation of the variables $G_{1,j}$ and $P_{1,j}$, since it is the input carry bit in the adder, $c_{in}$. Hence it is unnecessary to have this variable intervene except for the purposes of calculation operations. The invention thus proposes causing this carry bit to involve quite rapidly, by including it in the calculation of the signal g of least significance $g'_{1,1}$.

FIG. 4 shows a device for calculating parity bits of a sum according to the invention. This diagram should be compared with the diagram of FIG. 1 for the prior art.

The first stage 10' in the invention is modified compared with the stage 10 of the prior art. The new variables $g'_{1,j}$ and $p'_{i,j}$ are calculated in accordance with the following relationships:

$g'_{1,1} = a_{1,1} \cdot b_{1,1} + a_{1,1} \cdot c_{in} + b_{1,1} \cdot c_{in}$ $p'_{1,1} = a_{1,1} \oplus b_{1,1} \oplus c_{in}$ By the convention adopted above, the first subscript indicates the group of bits affected by this modification (in this case the least significant group A1, B1, C1 and S1).

The other values of $g_{i,j}$ and $p_{i,j}$ are unchanged and assume the same values as in the prior art embodiment:

$g_{i,j} = a_{i,j} \cdot b_{i,j}$    for each pair (i,j) where $((i=1), j=[2,3,\ldots,m])$ or $((i=[2,3,\ldots,K]), j=[1,2,\ldots,m])$ $p_{i,j} = a_{i,j} \oplus b_{i,j}$    for each pair (i,j) where $((i=1), j=[2,3,\ldots,m])$ or $((i=[2,3,\ldots,K]), j=[1,2,\ldots,m])$ where $g'_{1,1}$ assumes the value 1 when at least two of the variables $a_{1,1}$, $b_{1,1}$, and $c_{in}$ assume the value 1. Hence, $g'_{1,1} = c_{1,2}$.

Furthermore, $p'_{1,1}$ assumes the value 1 when at least two of the variables $a_{1,1}$, $b_{1,1}$, and $c_{in}$ assume the value 1. Hence, $p'_{1,1} = s_{1,1}$.

The new modified stage 10' is made up of conventional logic circuits of the "AND", "OR" and "EXCLUSIVE-OR" types, or other circuits adapted to a particular technology. Only the portion 11' is modified compared with the aforementioned patent; blocks 12, 13 and 14 are identical. Its realization is within the competence of one skilled in the art and hence will not be described in detail.

FIG. 5 shows the new adder modified to use these input variables. The bits $s_i$ of the result S of the addition are calculated with the conventional relationship:

$s_i = p_i \oplus c_i$ for $i = [2,3, \ldots, K*m]$

The carry bits $c_i$ being obtained by the following relationship:

$c_1 = c_{in}$ $c_i = G_{i-1} + P_{i-1} \cdot C_{i-1}$ for $i = [2,3, \ldots, K*m]$ The circuit of FIG. 4 uses modules of the M3 type with three inputs Px, Gx, cy and with one output cz verifying the following relationship:

$cz = Gx + Px \cdot cy$

Figure 9:
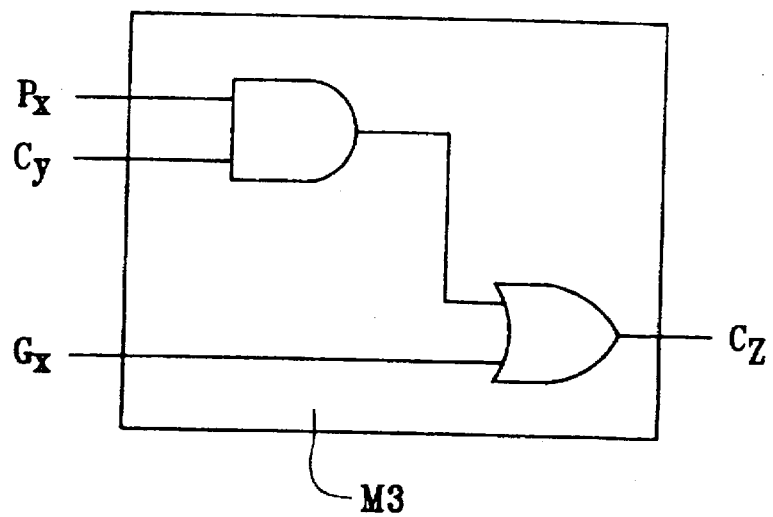
FIG. 9 shows a module M3 used in the invention.

FIG. 9 shows an exemplary embodiment of a module M3 with the aid of logic elements of the "AND", "OR" type. Once again, one skilled in the art will be able to imagine other embodiments with the aid of elements that are adapted to a particular technology.

The modules of type M1 and M3 are arranged in an assembly called a "recurrence solver", which is known in the art of adders, and which will not be described in detail here. It should merely be noted that the values $c_{1,2} = g'_{1,1}$ and $s_{1,1} = p'_{1,1}$, which are directly available at the output of the modified block 10', enable simplification of the adder structure compared with the prior art. The block 31' that performs the addition of the least significant group A1 and B1, producing the result S1, uses one less "EXCLUSIVE-OR" gate and one less module M3 than the corresponding circuit in the prior art. The other blocks 32, 33 and 34 are unchanged.

The values $p_{i,j}$ and $g_{i,j}$ or $p'_{i,j}$ and $g'_{i,j}$ are also introduced into a parity calculation stage 60. This stage simultaneously replaces both the look ahead blocks 21–24 for specific carry bits of the parity bit generator, and the block 41–44 for calculating parity bits mentioned in the aforementioned prior art patent. The stage 60 further receives the parity bits $PA_i$ and $PB_i$ associated with the respective operands A and B. These parity bits $PA_i$ and $PB_i$ originate in two respective registers RPA and RPB, and in this example are made up of four bits $PA_1$–$PA_4$ and $PB_1$–$PB_4$, respectively, each bit indicating the parity associated with one of the four 8-bit groups making up the two operands. The stage 60 further receives a variable $c_{in} = c_{1,1}$, which is the input carry bit in the adder.

The operator 60 can be considered to be made up of a plurality of operators 61, 62, 63 and 64, associated with the respective groups of which the operands are formed. It will be seen hereinafter that if these operators which process the higher significance groups $(i=[2, 3, \ldots, K])$ all have the same structure, then the operators 61 that processes the groups made up of the m least significant bits (i=1) have a simplified structure. At the output, the operator 61 directly furnishes the value $PS_1$ of the parity bit of the least significant group of the result. Furthermore, the operator 61 furnishes the value of the carry bit $c_{1,m+1} = c_9$, which is the least significant carry bit $c_{2,1}$ for the group of subscript i=2.

The other circuits for the groups with a subscript i higher than 1, that is, 62, 63 and 64 belonging to the stage 60, furnish respective variables $X_i$ and $Y_i$, conventionally defined by the following relationships:

$Y_i = G'_{i,1} \oplus G_{i,2} \oplus \ldots \oplus G_{i,j} \oplus \ldots \oplus G_{i,m-1}$ $X_i = P_{i,1} \oplus P_{i,2} \oplus \ldots \oplus P_{i,j} \oplus \ldots \oplus P_{i,m-1}$ where $G'_{i,1}$ is calculated by the already-mentioned relationship [paste in ...], in such a way as to calculate the parity associated with the sum S, and not only the parity associated with the carry word C. In the arbitrary example chosen of words broken down into four groups of eight bits each, the variable i thus assumes the values 2, 3 and 4, and the variable m is 8.

The circuits 62, 63 and 64 also furnish at their output the value of the least significant carry bit of the next-higher significance group. More precisely, the operator 62 furnishes the carry bit $c_{2m+1} = c_{17} = c_{3,1}$, and the operator 63 furnishes the carry bit $c_{3m+1} = c_{25} = c_{4,1}$. The operator 64 furnishes the carry bit $c_{4m+1} = c_{33}$, which is a variable that indicates an overflow of the adder. In a variant, this carry bit $c_{4m+1}$ is not calculated, because it does not participate in the calculation of the parity bit.

A final stage made up of operators 52, 53 and 54 receives the variables $X_i$, $Y_i$ of the group thus corresponding to the carry bit signal obtained by the operators of stage 60 of next-lower significance. More precisely, the operator 52 receives the carry bit $c_9 = c_{2,1}$ obtained by the operator 61; the operator 53 receives the carry bit $c_{17} = c_{3,1}$ obtained by the operator 62; the operator 54 receives the carry bit $c_{25} = c_{4,1}$ obtained by the operator 63.

In a general way, by designating the input carry bit applied to the corresponding operator S as $c_{i,1}$, each operator 52–54 respectively furnishes an output signal $PS_i$ verifying the following relationship:

$$PS_i = Y_i \oplus c_{i,1} \cdot X_i^*$$

for $$(i=[2,3,\ldots,K])$$

There is no operator 51 in this embodiment, because the operator 61 furnishes the value $PS_1$ directly at its output.

The variables $PS_1$ through $PS_4$ thus obtained are accordingly the parity bits associated with each of the groups extracted from the sum.

It will be appreciated that the above device can easily be designed more generally for an arbitrary number K of groups and an arbitrary number m of bits per group. Examples of other common values in the adders are eight 4-bit groups, or sixteen 4-bit groups, with 64-bit adders.

With the aid of FIG. 6, the function of the parity bit calculation circuit 60 will now be described, together with the simplifications that can be achieved in this circuit by the introduction of the input carry bit $c_{in}$ in calculating the signal $g'_{1,1}$.

FIG. 6 shows the circuits 61 and 62 for calculating parity bits $PS_1$ and $PS_2$ associated with the two groups made up of two m consecutive bits of the least significant sum S (groups whose subscript i=1,2). The circuits 63 and 64 are identical with the circuit 62 and will not be described here.

We will begin by describing the circuit 61 that processes the groups made up of m consecutive bits of the least significant sum (i=1).

The circuit 61 includes a first operator 61a that receives the variables $p_{1,2}$, $g'_{1,1}$ through $p_{1,8}$, $g_{1,8}$ calculated by the circuit 11' explained above or by a separate but identical circuit. The circuit 11' may in fact be shared with the adder, but if the integrity of the device is to be improved it is preferable to use a circuit 11' independent of the adder, because using a common circuit 11' would mask the errors that could arise in this circuit. The variable $p'_{1,1}$ is not used, and compared with the prior art described in conjunction with FIG. 2, the variable $g_{1,1}$ is replaced by the variable $g'_{1,1} = a_{1,1} \cdot b_{1,1} + a_{1,1} \cdot c_{in} + b_{1,1} \cdot c_{in}$ already defined above. The other variables $p_{1,2}$ to $p_{1,8}$ and $g_{1,2}$ to $g_{1,8}$ are the same as those used in the prior art.

The operator 61a is made up of logic modules of a first type M1 and another type M3. The function of these two types of module is defined above. The use of these modules and their availability makes it possible to calculate the variables $G_{i,j}$ for (j=[2, 3, ..., m]) defined by the following recurrence relationships:

$$G_{1,j} = g_{1,j} + p_{1,j} \cdot G_{1,j-1}$$

where $$G_{1,1} = g'_{1,1}$$

In the operator 61a, the variables $P_{1,j}$ are not calculated.

All the values $G_{1,j}$ are modified, compared with the prior art, by replacing $g_{1,1}$ with the variable $g'_{1,1}$, which takes into account the input carry bit $c_{in}$. We have already seen that $g'_{1,1}$ is in fact equal to $c_{1,2}$, and hence $G_{1,1}=c_{1,2}$.

It can be demonstrated that the consecutive signals $G_{1,j}$ have as their value the usual values of the cumulative carry bits, such that one can calculate them with the aid of one additional carry ripple adder, that is:

$$G_{1,j} = c_{1,j+1}$$

for $$(j=[1,2,\ldots,m])$$

The way in which the first operator 61a is constructed by employing recurrence will now be described, with the subscript j indicating both the significance of the bit in question and a corresponding rank of the operator.

If j=1, then directly one obtains $G_{1,1}=g'_{1,1}=c_{1,2}$. If j=2, then furthermore $g'_{1,1}$ is combined with $p_{1,2}$, $g_2$ in a first module M3:1', which at its output furnishes $G_{1,2}=c_{1,3}$. If j=3, a second module M3:3' combines $p_{1,3}$, $g_{1,3}$ with $G_{1,2}$ originating in the first module M3. This module 3' furnishes $G_{1,3}=c_{1,4}$. If j=4, a first module M1 2' combines $p_{1,3}$, $g_{1,3}$ and $p_{1,4}$, $g_{1,4}$, and the output of this module is combined in another module M3 4' with the output of the module 1'. This module 4' furnishes $G_{1,4}$. This result is obtained thanks to the associativity of the functions performed by the modules M1 and M3.

To complete the construction of the operator 61a for j greater than 4, it suffices to pursue the following method:

Once the initial assembly is made for j with values between 1 and $2^n$, the assembly for j between $2^n+1$ and $2^{n+1}$ is obtained adding modules M1 disposed in accordance with the initial assembly but offset by 2n rows toward the most significant bits, thus furnishing new outputs. 2n additional modules M3 are now available, which combine the most significant outputs $G_{1,2n}$ originating in the initial assembly and at each of the new outputs, respectively.

The construction will stop at the m order (instead of m−1 in the embodiment of FIG. 2). In the example in question, variables $G_{1,j}$ for (j=[1, 2, ..., 8]) will then be available. These variables are respectively equal to the carry bits $c_{1,j+1}$ in the relationship mentioned.

The outputs $G_{1,j}$ of the operator 61a are then applied to the inputs of the operator 61b, composed of logic gates performing the "EXCLUSIVE-OR" function disposed in a binary tree. The circuit 61b thus calculates the EXCLUSIVE-OR of all the $G_{1,j}$ outputs and of the input carry bit $c_{1,1}=c_{in}$, or in other words the variable $Y_1$ defined as follows:

$$Y_1 = c_{1,1} \oplus G_{1,1} \oplus G_{1,2} \oplus \ldots \oplus G_{1,j} \oplus \ldots \oplus G_{1,m-1}$$

Since:

$$G_{1,j} = c_{1,j+1}$$

It is thus true that:

$$Y_1 = c_{1,1} \oplus c_{1,2} \oplus c_{1,3} \oplus \ldots \oplus c_{1,j} \oplus \ldots \oplus c_{1,m} = PC_1$$

Thus for this least significant group one now has the variable $Y_1$, calculated as before but by causing the value cin to intervene in the calculation of the variables $G_{1,j}$, it is equal to the parity of the carry bit word.

Since the following relationship applies:

$$PS_i = PA_i \oplus PB_i \oplus PC_i$$

where $PA_i$ and $PB_i$ are the respective parities associated with the groups whose subscript is i of the two operands A and B, it is seen that to obtain the parity bit associated with the corresponding group of the sum, once again the parity bits $PA_1$ and $PB_1$ must be introduced into the expression $Y_1$. In a preferred embodiment as illustrated by FIG. 6, the expression $$G_{1,2} \oplus G_{1,1} \oplus c_{1,1}$$

is replaced by the expression $G_{1,2} \oplus G_{1,1} \oplus c_{1,1} \oplus PA_1 \oplus PB_1$.

Thus to calculate the parity associated with the least significant group of the sum, the value $Y_1$ will be used, defined by the following relationship:

$$Y_1 = c_{1,1} \oplus G_{1,1} \oplus G_{1,2} \oplus \ldots \oplus G_{1,j} \oplus \ldots \oplus G_{1,m-1} \oplus PA_1 \oplus PB_1 = PS_1$$

Other ways in which the value $PA_1$, $PA_2$ of the parity bits of the operands can be inserted into the expression $Y_1$ are within the competence of one skilled in the art, all by way of a choice of implementation. Preferably, these parity bits will be inserted in such a way as to minimize the number of logic layers of the circuit and to simplify its physical embodiment.

The circuit 61 of FIG. 6 thus embodied directly at its output furnishes the value $PS_1$ of the parity bit of the sum for the least significant group. In addition, the output $G_{1,8} = c_9$ furnishes the value of the least significant carry bit for the group whose subscript i=2, that is, the value $c_{2,1}$.

The stage 61 thus made in this example with a size of groups m of eight bits includes a total of five modules M1, seven modules M3, and nine "EXCLUSIVE-OR" gates.

To achieve the same function, in the prior art of FIGS. 1–3, two separate circuits 21 and 41 were necessary. These two circuits required a total of 13 modules M1, four modules M3, six modules M2, and two "EXCLUSIVE-OR" gates plus an operator 51. Since the modules M2 are in fact made up of two "EXCLUSIVE-OR" gates, and the modules M1 are more complex than the modules M3, it will be appreciated that the invention enables substantial economy of circuits. Moreover, a single block 61 is necessary instead of two parallel blocks 21 and 41, which facilitates integration using the "data path" technology.

The circuits 62, 63 and 64 for calculating the parity bits associated with the groups of bits of the sum other than the least significant group will now be described. Since all the circuits are identical, the description will be limited to a single one of them, for example the circuit 62.

Naturally, it would be possible to construct the circuit 62 on the model of the circuit 61, by introducing the input carry bit $c_{2,1}$ originating in the circuit 61 into the calculation of a modified variable $g'_{2,1}$, which would allow applying all the simplifications made in the circuit 61 to the circuit 62 as well. Nevertheless, the carry bit $c_{2,1}$ is not obtained until the very end of the operations of the circuit 61. This means that the circuit 62 could not begin to function until the circuit 61 had nearly completed its operations, which would be incompatible with the requirement for high-speed operation of the device.

Consequently, the circuit 62 will be constructed in the same way as the circuit 41 of the prior art, so as to cause this input carry bit $c_{2,1}$ to intervene in the ensuing operations as late as possible.

The circuit 62 is composed of a first operator 62a and a second operator 62b. This will not be described in detail here, and the reader may return to the description associated with FIG. 2.

The iterative construction method of the operator 41a described in connection with that drawing figure applies to the construction of the operator 62a as well. However, the construction stops at the order m instead of stopping at the order m−1 as in the prior art. In the example in question, variables $P_{2,j}$, $G_{2,j}$ of order 1 through 8 will now be available at the output of the operator 62a.

The outputs of the operator 62a up to the order m−1 are then applied to the inputs of the second operator 62b.

The operator 62b is identical to the operator 41b described in conjunction with FIG. 2. It is accordingly made up of modules M2 disposed in a tree. At the output, it accordingly furnishes the two variables X2 and Y2 defined by the following relationships:

$$X_2 = P_{2,1} \oplus P_{2,2} \oplus \ldots \oplus P_{2,j} \oplus \ldots \oplus P_{2,m-1}$$

$$Y_2 = G'_{2,1} \oplus G_{2,2} \oplus \ldots \oplus G_{2,j} \oplus \ldots \oplus G_{2,m-1}$$

As before, the variable $G'_{2,1}$ is defined in such a way as to cause the parity values associated with the group of subscript i=2 of the operands to intervene in the expression $Y_2$ as follows:

$$G'_{2,1} = G_{2,1} \oplus PA_2 \oplus PB_2$$

Naturally, other combinations of parity bits $PA_2$ and $PB_2$ with one or two variables $G_{2,i}$ or directly with the variable $Y_2$ are possible and within the competence of one skilled in the art.

The variables $X_2$, $Y_2$ and the carry bit $c_{2,1}$ originating in the operator whose order is next-lower than that of 61 are applied to an operator 52 whose output $PS_2$ is linked with the inputs by the following relationship:

$$PS_2 = Y_2 \oplus c_{2,1} \cdot X_2^*$$

The variables $P_{2,m}$ and $G_{2,m}$, in this example $P_{2,8}$ and $G_{2,8}$, are applied with the input carry bit $c_{2,1}$ to module M3. If $c_{i,1}$ is the least significant carry bit in the group whose subscript is i, then for values of j greater than 1 the following relationship applies:

$$c_{i,j+1} = G_{i,j} + P_{i,j} \cdot c_{i,1}$$

By setting j=m, the following is obtained:

$$c_{i,1} = G_{i-1,m} + P_{i-1,m} \cdot c_{i-1,1}$$

for $$(i = [3, 4, \ldots, K])$$

If i=3 and m=8, then the output of this module M3 furnishes the value of the carry bit $c_{2,9}$. This carry bit will be the input carry bit $c_{3,1}$ of the circuit 63 that processes the group of next-higher significance. The presence of the carry look ahead circuit 21a described in conjunction with FIG. 1 is accordingly superfluous.

In this example, with a size m of eight bits, the circuit of FIG. 6 uses 12 modules M1, six modules M2, and one module M3. The equivalent circuits 42 and 22 in the prior art require 16 modules M1, six modules M2, and two modules M3. Hence major simplification of the device is achieved. Moreover, the topological disposition of these circuits is better suited for integration by the "data path" technology.

In a preferred embodiment, the parity generator according to the invention will be made by CMOS technology. In that technology, the functions performed by the modules M1, M2 or M3 are slower and require more transistors than the corresponding complementary or dual functions. One skilled in the art will accordingly preferably make the circuits of FIGS. 5–9 with modules that perform the complementary or dual functions of the modules M1, M2 and M3 wherever that should prove appropriate, on the condition that inverters are provided at the proper locations. All these considerations depend on the technology used and are matters of choice in embodiment, within the competence of one skilled in the art.

While the preferred forms and embodiments of the invention have been illustrated and described, it will be apparent to those of ordinary skill in the art that various changes and modifications may be made without deviating from the inventive concepts and spirit of the invention as set forth above, and it is intended by the appended claims to define all such concepts which come within the full scope and true spirit of the invention.

We claim:

1. An adder for adding two binary numbers (A,B), said adder comprising:

means for generating a carry word (C) and producing a result (S), using K groups, with K≥2, of m consecutive bits extracted from said binary numbers (A,B), carry word (C) and result (S) and formed respectively by bits $a_{i,j}$, $b_{i,j}$, $c_{i,j}$ and $s_{i,j}$, where i={1,2, ..., K} and indicates one of said K groups and i=1 for the m least significant bits, j={1,2, ..., m} and indicates a significance of a bit in a group, $c_{1,1}$, is a first input carry bit for the adder and $c_{i,1}$, with i={2, ..., K}, are second input carry bits, said generating means calculating, for i≠1 and j={1,2, ..., m}, the following values:

$$p_{i,j}=a_{i,j} \oplus b_{i,j}$$

$$g_{i,j}=a_{i,j} \cdot b_{i,j}$$

and, for i=1, the following values:

$$p_{1,j}=a_{1,j} \oplus b_{1,j}$$

for j={2, ..., m}

$$g_{1,1}=a_{1,1} \cdot b_{1,1}+a_{1,1} \cdot c_{1,1}+b_{1,1} \cdot c_{1,1}$$

$$g_{1,j}=a_{1,j} \cdot b_{1,j}$$

for j={2, ..., m};

a parity generator circuit (50', 60) receiving said calculated values and K parity bits of said respective binary numbers (A,B) and calculating K parity bits ($PS_i$) of said respective K groups extracted from said result (S), said parity generator circuit including a first operator (61a) for calculating a value $G_{1,j}$ of $G_{i,j}$, with i=1, as follows:

$$G_{1,j}=g_{1,j}+p_{1,j} \cdot G_{1,j-1}$$

for j={2, ..., m} and with $G_{1,1}=g_{1,1}$ and a second operator (61b) for calculating:

$$Y_1=c_{1,1} \oplus G_{1,1} \oplus G_{1,2} \oplus \ldots \oplus G_{1,j} \ldots \oplus G_{1,m-1} \oplus PA_1 \oplus PB_1$$

where $PA_1$ and $PB_1$ are values of said parity bits $PA_i$ and $PB_i$, with i=1 and $Y_1$ is a value corresponding to a parity bit $PS_1$ of said parity bits $PS_i$ with i=1.

2. The adder of claim 1, wherein:

said first operator (61a) includes logic modules of a first type (M1) receiving four inputs ($P_x$, $G_x$, $P_y$ and $G_y$) and providing two outputs ($P_z$, $G_z$) as follows:

$$P_z=P_y \cdot P_x$$

$$G_z=G_y+P_y \cdot G_x;$$

and logic modules of a second type (M3) receiving three inputs ($P_x$, $G_x$ and $c_y$) and providing an output ($c_z$) as follows:

$$c_z=G_x+P_x \cdot c_y;$$

and said modules of said first and second types being used in connection with the following recurrent steps:

a) for j=1, $G_{1,1}=g_{1,1}$ is obtained directly;

b) for j=2, a first module (1') of said second type (M3) operates on $p_{1,2}$, $g_{1,2}$ and $g_{1,1}$ and furnishes $G_{1,2}$;

c) for j={3,4}, a first module (2') of said first type (M1) operates on $p_{1,3}$, $g_{1,3}$ and $p_{1,4}$, $g_{1,4}$ and furnishes two outputs, a second module (3') of said second type (M3) operates on $G_{1,2}$, $p_{1,3}$ and $g_{1,3}$ and furnishes $G_{1,3}$, a third module (4') of said second type operates on $G_{1,2}$ and said outputs of said first module (2') of said first type and furnishes $G_{1,4}$, thus forming an initial assembly for j={1, ..., $2^n$} with n=2, and d) for j={$2^n+1$, ..., $2^{n+1}$} an assembly is recurrently obtained by adding said modules of said first type (M1) disposed in accordance with said initial assembly but offset by $2^n$ ranks toward the most significance bits in order to furnish additional outputs; and $2^n$ modules of said second type (M3) for operating on the most significant outputs $G_{1,2^n}$ of said initial assembly and each of said additional outputs, respectively, and furnishing said following values ($G_{1,5}$–$G_{1,8}$), respectively.

3. The adder of claim 2, wherein said second operator includes logic gates of EXCLUSIVE-OR type disposed in a tree having inputs for receiving said outputs $G_{1,j}$ through $G_{1,m-1}$ of said first operator, said parity bits $PA_1$ and $PB_1$ and said first input carry bit $c_{1,1}$, said outputs, parity bits and input carry bit being taken two by two as much as possible and said gates being disposed to calculate said value $Y_1$.

4. The adder of claim 1, wherein said second operator includes logic gates of EXCLUSIVE-OR type disposed in a tree having inputs for receiving said outputs $G_{1,j}$ through $G_{1,m-1}$ of said first operator, said parity bits $PA_1$ and $PB_1$ and said first input carry input $c_{1,1}$, said outputs, parity bits and input carry bit being taken two by two as much as possible and said gates being disposed to calculate said value $Y_1$.

5. The adder of claim 1, wherein said parity generator circuit further includes:

third operators (62a, 63a, 64a) for calculating respective values for respective values of i={2, ..., K}, of $$G_{i,j}=g_{i,j}+p_{i,j} \cdot G_{i,j-1}$$

for j={2, ..., m} and with $G_{i,1}=g_{i,1}$ $$P_{i,j}=p_{i,j} \cdot P_{i,j-1}$$

for j={2, ..., m} and with $P_{i,1}=P_{i,1}$ fourth operators (62b, 63b, 64b) for calculating respective values, for i={2, ..., K}, of:

$$Y_i=G_{i,1} \oplus G_{i,2} \oplus \ldots \oplus G_{i,m-1} \oplus PA_i \oplus PB_i$$

$$X_i = P_{i,1} \oplus P_{i,2} \oplus \ldots \oplus P_{i,m-1}$$

where $PA_i$ and $PB_i$ represent parities of respective $i^{th}$ bit of said binary numbers A and B, and fifth operators (52, 53, 54) for calculating respective values, for i={2, ..., K}, of:

$$PS_i = Y_i \oplus c_{i,1} \cdot X_i^*$$

where $c_{i,1}$, are said second input carry bits and $X_i^*$ is the complement of $X_i$.

6. The adder of claim 5, wherein said fifth operator (52) for i=2 uses said second input carry bit $c_{2,1}$ as follows:

$$c_{2,1} = G_{1,m}$$

and said parity generator circuit further comprises means (M3) for calculating said second input carry bits $c_{i,1}$, for i={3, ..., K}, used by said respective fifth operators, as follows:

$$c_{i,1} = G_{i-1,m} + P_{i-1,m} \cdot c_{i-1,1}.$$

7. The adder of claim 1, wherein said generating means is separated from said parity generator circuit.

8. The adder of claim 1, wherein $p_{1,1} = a_{1,1} \oplus b_{1,1} \oplus c_{1,1}$.

9. The adder of claim 1, wherein said carry word (C) is generated by carry means (60) connected to said generating means to receive said values $p_{i,j}$, except for value $p_{1,1}$, and said values $g_{i,j}$.

10. The adder of claim 1, wherein said result (s) is produced by adding means (30, 31', 32–34) from the following relation:

$$s_{i,j} = p_{i,j} \oplus c_{i,j}$$

with $$s_{1,1} = p_{1,1} = a_{1,1} \oplus b_{1,1} \oplus c_{1,1}$$

and $$s_{1,2} = p_{1,2} \oplus g_{1,2}.$$

* * * * *

UNITED STATES PATENT AND TRADEMARK OFFICE
CERTIFICATE OF CORRECTION

PATENT NO. : 5,689,451
DATED : November 18, 1997
INVENTOR(S) : Delamotte et al.

It is certified that error appears in the above-indentified patent and that said Letters Patent is hereby corrected as shown below:

Column 20, Claim 4, line 43, delete second occurrence of "input".

Signed and Sealed this

Twenty-eighth Day of July, 1998

Attest:

BRUCE LEHMAN

*Attesting Officer*  *Commissioner of Patents and Trademarks*